(12) United States Patent
Mustafa et al.

(10) Patent No.: US 12,288,795 B2
(45) Date of Patent: Apr. 29, 2025

(54) APPLICATION AND METHOD OF INTEGRATED BAR PATTERNS IN DETECTOR STRUCTURES

(71) Applicant: Raytheon Company, Waltham, MA (US)

(72) Inventors: Jamal I. Mustafa, Goleta, CA (US); Richard J. Peralta, Goleta, CA (US)

(73) Assignee: Raytheon Company, Arlington, VA (US)

( * ) Notice: Subject to any disclaimer, the term of this patent is extended or adjusted under 35 U.S.C. 154(b) by 845 days.

(21) Appl. No.: 17/390,872

(22) Filed: Jul. 31, 2021

(65) Prior Publication Data

US 2023/0032232 A1    Feb. 2, 2023

(51) Int. Cl.
*H01L 27/146* (2006.01)
*G01M 11/02* (2006.01)
*H04N 17/00* (2006.01)

(52) U.S. Cl.
CPC ... *H01L 27/14625* (2013.01); *G01M 11/0292* (2013.01); *H01L 27/14685* (2013.01); *H04N 17/002* (2013.01)

(58) Field of Classification Search
CPC ............. H01L 27/146; H01L 27/14601; H01L 27/14609; H01L 27/1462; H01L 27/14623; H01L 27/14625; H01L 27/14643; H01L 27/14683; H01L 27/14685; H04N 17/00; H04N 17/002; G01M 11/02; G01M 11/0292
See application file for complete search history.

(56) References Cited

U.S. PATENT DOCUMENTS

| | | | |
|---|---|---|---|
| 9,488,765 B2* | 11/2016 | Kang | H01L 27/1262 |
| 10,356,293 B2* | 7/2019 | Kim | H01L 27/14607 |
| 10,777,692 B2* | 9/2020 | Cheng | H01L 31/035254 |
| 2010/0035407 A1* | 2/2010 | Goto | H10K 71/00 |
| | | | 438/584 |
| 2015/0014627 A1* | 1/2015 | Yu | H10K 10/29 |
| | | | 257/77 |
| 2016/0274285 A1* | 9/2016 | Kang | H01L 27/1262 |
| 2017/0310859 A1* | 10/2017 | Kim | H01L 27/14607 |
| 2019/0267498 A1* | 8/2019 | Cheng | H01L 31/0745 |
| 2020/0319345 A1* | 10/2020 | Cheng | H01L 27/14616 |
| 2020/0395393 A1* | 12/2020 | Cheng | G01S 7/4914 |
| 2021/0184144 A1* | 6/2021 | Jongman | H01L 27/1244 |
| 2021/0189547 A1* | 6/2021 | Yamazaki | C23C 14/3414 |
| 2023/0032232 A1* | 2/2023 | Mustafa | H01L 27/14685 |

* cited by examiner

*Primary Examiner* — John R Lee

(57) ABSTRACT

An optical device and method of forming the optical device include a substrate having an integrated metal pattern proximate a detector or top absorber layer to minimize diffraction effects. The integrated metal pattern is aligned with selective regions of the pixel array structure of the detector layer for masking pixels of the pixel array structure. The pattern of the integrated metal pattern may be used for alignment with modulation transfer function (MTF) structures of the detector layer for MTF testing, for alignment with reference pixels of the detector layer for spatial reference used during calibration of the optical device, or for forming a polarizer grid.

20 Claims, 6 Drawing Sheets

APPLICATION AND METHOD OF INTEGRATED BAR PATTERNS IN DETECTOR STRUCTURES

FIELD OF DISCLOSURE

The disclosure relates to an optical device and method of forming an optical device, and more particularly, to optical detectors used for imaging.

DESCRIPTION OF RELATED ART

The modulation transfer function (MTF) is a characteristic of an optical device, e.g. a sensor or detector, and corresponds to the ability of the optical device to resolve elements of a scene during imaging. The MTF is the capacity of the detector to transfer the modulation of an input signal at a specific spatial frequency to the output of the detector. Prior to operation of an optical system, such as in an aircraft or spacecraft, the MTF of the detector optics is measured to determine the contribution to the total MTF such that the contribution of only the detector is obtained. MTF is a significant figure of merit for sensors or detector arrays in applications in which accurate target positions are to be obtained by the detector array.

MTF is typically measured using specific patterned structures that are formed on the detector. For example, the patterns may include sharp edges or gradients of bars. However, measuring the MTF of a detector may be difficult due to the optical setup required to project a particular pattern, such as a bar pattern, on the detector, or due to destructively patterning a mask on the detector surface that covers some of the pixels of the pixel structure for measurement. Prior attempts to provide masking patterns are deficient in that the pattern is formed remotely within the structure away from the detector surface where light is absorbed. Consequently, diffraction effects can degrade the MTF measurement.

SUMMARY OF DISCLOSURE

The present application provides an optical device and method of forming the optical device that include a substrate having an integrated metal pattern proximate a detector or top absorber layer to minimize diffraction effects. The integrated metal pattern is aligned with selective regions of the pixel array structure of the detector layer for masking pixels of the pixel array structure. The pattern of the integrated metal pattern may be used for alignment with modulation transfer function (MTF) structures of the detector layer for MTF testing, for alignment with reference pixels of the detector layer for spatial reference used during calibration of the optical device, or for forming a polarizer grid. Other applications may also be suitable.

The patterned metal layer may be formed on the main substrate layer using damascening or other integrated circuit interconnect methods. Many different patterns may be suitable and the pattern may be dependent on the application. An intervening layer is provided above the patterned metal layer as a transition between the metal-patterned substrate layer and the detector layer. The intervening layer has a thickness that is less than the main substrate layer and may be formed of a substrate material. In an exemplary embodiment, the intervening layer is formed to cap the patterned metal layer for epitaxial growth of a detector material for the detector layer. In other exemplary embodiments, the intervening layer may be formed as a layered structure or formed by direct bond hybridization.

According to an aspect of the disclosure, an optical device may include a metal-patterned substrate arranged directly adjacent an absorber layer.

According to an aspect of the disclosure, an optical device may include a metal-patterned substrate, a detector layer, and an intervening layer that transitions from the metal-patterned substrate to the detector layer.

According to an aspect of the disclosure, an optical device may include a metal-patterned substrate having a pattern that is aligned with MTF pixel array structures of a detector layer for MTF testing prior to operation of the optical device.

According to an aspect of the disclosure, an optical device may include a metal-patterned substrate having a pattern that is aligned with reference pixels of a detector layer for spatial reference during calibration of the optical device.

According to an aspect of the disclosure, a method of forming an optical device may include damascening, or etching a pattern in a substrate, filling trenches with a metal material, planarizing the patterned substrate, and capping the planarized patterned substrate with another substrate layer for subsequent growth and processing of a detector material.

According to an aspect of the disclosure, a method of forming an optical device having a metal-patterned substrate arranged directly adjacent an absorber layer may include an integrated circuit interconnect process.

According to an aspect of the disclosure, a method of measuring an MTF of an optical device includes using a metal-patterned layer that is integrated on a substrate layer adjacent an absorber layer.

According to an aspect of the disclosure, a method of calibrating an optical device includes using a metal-patterned layer that is integrated on a substrate layer adjacent an absorber layer for spatial reference.

According to an aspect of the disclosure, an optical device includes a main substrate layer, a detector layer having a pixel array structure, a patterned metal layer that is disposed on the main substrate layer between the main substrate layer and the detector layer, the patterned metal layer having a pattern that is aligned with selective regions of the pixel array structure of the detector layer for masking the selective regions, and an intervening layer interposed between the patterned metal layer and the detector layer.

According to an embodiment of any paragraph(s) of this summary, the patterned metal layer may be integrated into the main substrate layer.

According to an embodiment of any paragraph(s) of this summary, the intervening layer may have a thickness that is smaller than a thickness of the main substrate layer.

According to an embodiment of any paragraph(s) of this summary, the patterned metal layer may include an opaque pattern.

According to an embodiment of any paragraph(s) of this summary, the intervening layer may be formed of a substrate material.

According to an embodiment of any paragraph(s) of this summary, the intervening layer may be formed of a plurality of sub-layers.

According to an embodiment of any paragraph(s) of this summary, the intervening layer may be an oxide layer.

According to an embodiment of any paragraph(s) of this summary, the patterned metal layer may include a pattern that is formed of rows or columns of bars, or a barcode pattern.

According to an embodiment of any paragraph(s) of this summary, the selective regions of the pixel array structure correspond to reference detector pixels.

According to an embodiment of any paragraph(s) of this summary, the pattern may form a polarizer grid.

According to an embodiment of any paragraph(s) of this summary, the polarizer grid pattern may be configured for horizontal, vertical, and/or diagonal polarization.

According to an embodiment of any paragraph(s) of this summary, the polarizer grid pattern may be configured for multiple polarization states in a color filter array.

According to another aspect of the disclosure, a method of measuring a modulation transfer function of an optical device may include masking selective regions of a pixel array structure with a pattern of a metal-patterned substrate, the pattern being a bar pattern.

According to still another aspect of the disclosure, a method of calibrating an optical device may include aligning a pattern of a metal-patterned substrate to reference pixels of the pixel array structure, and determining a spatial resolution of the optical device based on alignment of the patterned metal layer to the reference pixels.

According to still another aspect of the disclosure, a method of forming an optical device may include integrating a patterned metal layer in a main substrate layer, forming an intervening layer over the patterned metal layer, growing a detector layer having a pixel array structure on the intervening layer, and aligning a pattern of the patterned metal layer with the pixel array structure of the detector layer.

According to an embodiment of any paragraph(s) of this summary, integrating the patterned metal layer in the main substrate layer may include etching the pattern in the main substrate layer, depositing a metal material into trenches of the pattern, and planarizing a surface of the main substrate layer containing the deposited metal material.

According to an embodiment of any paragraph(s) of this summary, integrating the patterned metal layer in the main substrate layer may include damascening.

According to an embodiment of any paragraph(s) of this summary, forming the intervening layer may include capping the patterned main substrate layer with a layer of substrate material having a thickness that is less than a thickness of the main substrate layer.

According to an embodiment of any paragraph(s) of this summary, forming the intervening layer may include using direct bond hybridization to form an oxide layer.

According to an embodiment of any paragraph(s) of this summary, aligning the pattern of the patterned metal layer with the pixel array structure includes aligning the pattern with reference detector pixels of the pixel array structure for calibration.

According to an embodiment of any paragraph(s) of this summary, the method may include forming the pattern of rows or columns of bars or forming a barcode pattern.

According to an embodiment of any paragraph(s) of this summary, the method may include forming the pattern as a polarizer grid.

To the accomplishment of the foregoing and related ends, the disclosure comprises the features hereinafter fully described and particularly pointed out in the claims. The following description and the annexed drawings set forth in detail certain illustrative embodiments of the disclosure. These embodiments are indicative, however, of but a few of the various ways in which the principles of the disclosure may be employed. Other objects, advantages and novel features of the disclosure will become apparent from the following detailed description when considered in conjunction with the drawings.

BRIEF DESCRIPTION OF DRAWINGS

The annexed drawings, which are not necessarily to scale, show various aspects of the disclosure.

DETAILED DESCRIPTION

The principles described herein have application in optical devices and systems, such as in sensor or detector structures used for surveillance or imaging. The detector structure may be implemented in an optical system for a moving platform, such as an aircraft, spacecraft, sea vessel, or land vehicle. The moving platform may be used in a military application and configured to execute a mission, such as detecting and imaging a desired target. Other non-military applications may also be suitable, such as imaging performed for research. One exemplary application for the optical device described herein includes modulation transfer function (MTF) measuring that occurs during testing of optical devices, prior to operation. Another exemplary application includes providing spatial reference for calibration during a mission. Still other applications include polarizer grids and 3D heterogeneous integration, i.e. the 3D integration of different system devices such as processors and memories. Many other applications may be suitable.

Figure 1:
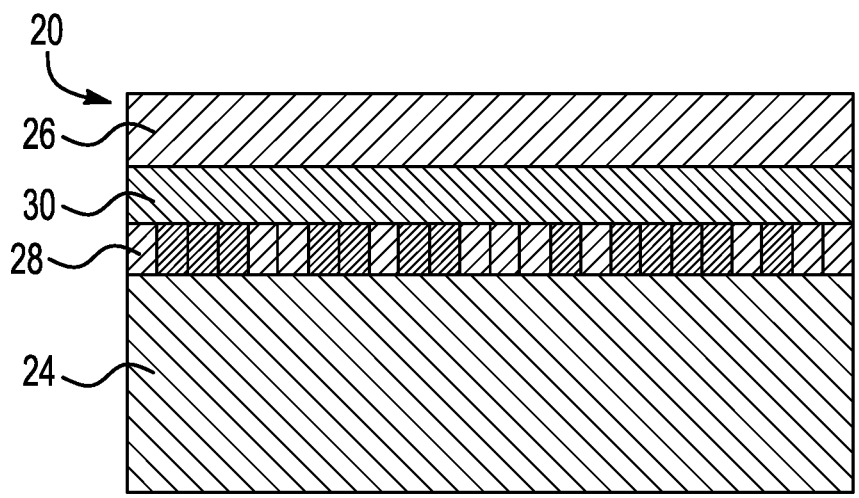
FIG. 1 shows a sectional view of an optical device according to an exemplary embodiment of the present application in which the optical device includes a metal-patterned substrate layer.
Figure 2:
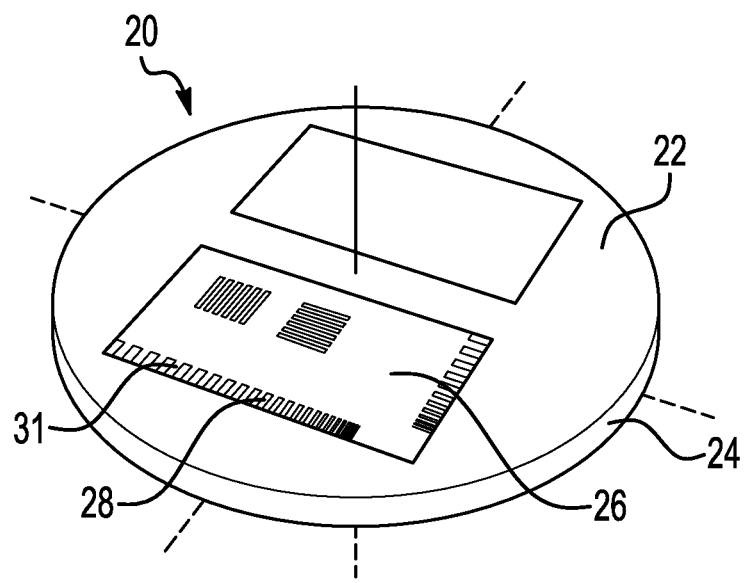
FIG. 2 shows an oblique view of the optical device of FIG. 1.

Referring first to FIGS. 1 and 2, an optical device 20 according to the present application is shown. The optical device 20 may be a sensor or detector for use in an optical system, such as an optical system used for detection or imaging. The optical device 20 may have any suitable shape, such as the disc shape shown in FIG. 2. Other shapes may be suitable and the shape may be dependent on the application. The optical device 20 includes a plurality of stacked planar layers that are stacked in a direction that is normal to an imaging plane 22 of the optical device 20.

The stacked layers include a main substrate layer 24 and a detector layer 26 which may be a top absorber layer of the optical device 20 where light is absorbed during operation. The main substrate layer 24 has a thickness that is greater than a thickness of the detector layer 26 and the main substrate layer 24 may be the thickest layer of the optical device 20. Any suitable material may be used for the main substrate layer 24 and the main substrate layer 24 may be in the form of a semiconductor. Exemplary materials include silicon, germanium, and gallium arsenide. Any suitable insulating or dielectric material may be used. Many other materials may be suitable and the material may be dependent on the application.

A patterned metal layer 28 is integrated into the main substrate layer 24 between the main substrate layer 24 and the detector layer 26. An intervening layer 30 is interposed between the patterned metal layer 28 and the detector layer 26 and forms a transition from the metal-patterned substrate layer 24 to the detector layer 26. The intervening layer 30 may be formed of a substrate material, a layered structure, or oxides formed during direct bond hybridization. The patterned metal layer 28 is formed to have an opaque pattern that is aligned with selective regions of a pixel array structure of the detector layer 26 for covering or masking the pixel array structure. The detector layer 26 may have any suitable pixel array structure having a plurality of pixels that define resolution elements of the optical device 20. The pixels may be regularly spaced and have the same sizes, or the pixels may have varying spacing and sizes. The pixel array structure may be dependent on the application.

In an exemplary application in which the MTF of the optical device 20 is measured during testing, prior to operation of the optical device 20, the detector layer 26 may have a specific pixel array structure for measuring MTF, and the selective region for the patterned metal layer 28 may correspond to the MTF pixel array structures. The MTF of a single module of the optical device 20, which may be characterized by a pixel, may be measured and the total MTF may be a combination of different MTFs. The resolution of the optical device 20 may then be characterized using the MTF, which may be useful for target acquisition in subsequent operation. In another exemplary application, the pattern of the patterned metal layer 28 may correspond to reference pixels of the pixel array structure to provide spatial reference during calibration of the optical device 20 during operation, such as during flight or orbit of an aircraft or spacecraft in which the optical device 20 is arranged. The spatial resolution of the optical device 20 may thus be determined. The MTF pixel array structures may also be used for spatial reference during calibration.

The patterned metal layer 28 may be formed of any suitable metal material, such as aluminum or copper. Other metal materials or alloys may also be suitable. Forming the patterned metal layer 28 may include using a damascening process or any suitable integrated circuit interconnect process, such as an aluminum or copper interconnect. An exemplary aluminum interconnect includes depositing a layer of aluminum, patterning and etching the aluminum, and subsequently depositing an insulating (dielectric) material to separate conducting lines. An exemplary copper interconnect includes depositing an insulating material, such as silicon dioxide, forming trenches, filling the trenches with copper, and removing the excess copper to form a flat surface for subsequent processing.

For example, a pattern 31 of the patterned metal layer 28 may be etched in the main substrate layer 24. As shown in FIG. 2, the pattern 31 may correspond to MTF pixel array structures of the detector layer 26, such as rows or columns of bars, or barcode-like patterns. The trenches of the pattern 31 may be filled with a metal material and subsequently planarized over the main substrate layer 24 to form a flat surface of the main substrate layer 24 that includes the integrated patterned metal layer 28.

After the metal-patterned main substrate layer 24 is planarized, the main substrate layer 24 may be capped with the intervening layer 30 arranged over the patterned metal layer 28. The intervening layer 30 has a thickness that is less than the thickness of the main substrate layer 24. The thickness of the intervening layer 30 or layers is minimized to reduce diffraction effects which depends on the wavelength of the incident light. The thickness of the intervening layer 30 may be similar to or smaller than the thickness of the detector layer 26. Any suitable substrate material may be used to form the intervening layer 30, such as silicon, germanium, and gallium arsenide. In exemplary embodiments, gallium antimonide and indium phosphide may be suitable. Many other materials may be suitable and the material may be dependent on the application. The intervening layer 30 and the main substrate layer 24 may be formed of the same or different material. In exemplary embodiments, the intervening layer 30 may be formed of a plurality of sub-layers.

The intervening layer 30 may be configured to enable subsequent epitaxial (epi) growth of a detector material for the detector layer 26, which may be in the form of an epi wafer. One or more detector dies may be used and each die may form an individual sensor for the detector layer 26. The patterned metal layer 28 forms a mask that covers some of the pixels of the pixel structure formed in the detector layer 26. The pixels may be reference pixels that are used for spatial reference, such as during calibration. Any suitable material may be used for the detector layer 26, such as a semiconducting material. The detector layer 26 may be formed of a plurality of layers. Compounds such as silicon, mercury cadmium telluride, gallium nitride or gallium arsenide may be suitable. Many other materials and superlattices of different compounds, such as those of indium arsenide and indium arsenide antimonide, may be suitable. In exemplary embodiments, the detector layer 26 may be formed of the same material as the main substrate layer 24 and/or the intervening layer 30.

Incorporating the metal pattern directly into the substrate on which the detector is grown is advantageous in ensuring that the pattern is proximate to the absorbing layers that absorb light. Accordingly, in an MTF measurement application, diffraction effects are not introduced into an MTF measurement and the MTF of the detector is able to be measured without any optical relay. In conventional optical devices, the distance between the patterned surface and the surface where light is absorbed may be too large, such that the main substrate layer would have to be thinned. In contrast, incorporating the metal pattern on a top surface of the substrate enables the pattern to be arranged proximate the backside of the detector layer such that it is not necessary to thin the main substrate layer.

Figure 3:
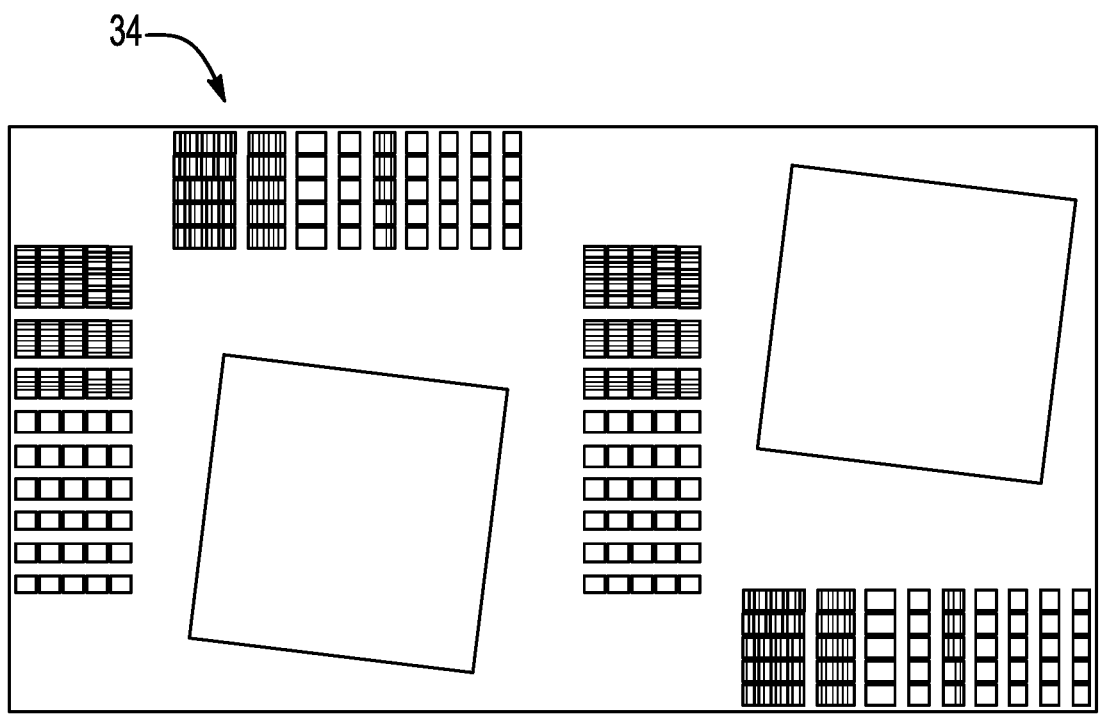
FIG. 3 shows an exemplary bar pattern for the metal-patterned substrate layer of FIG. 1.
Figure 4:
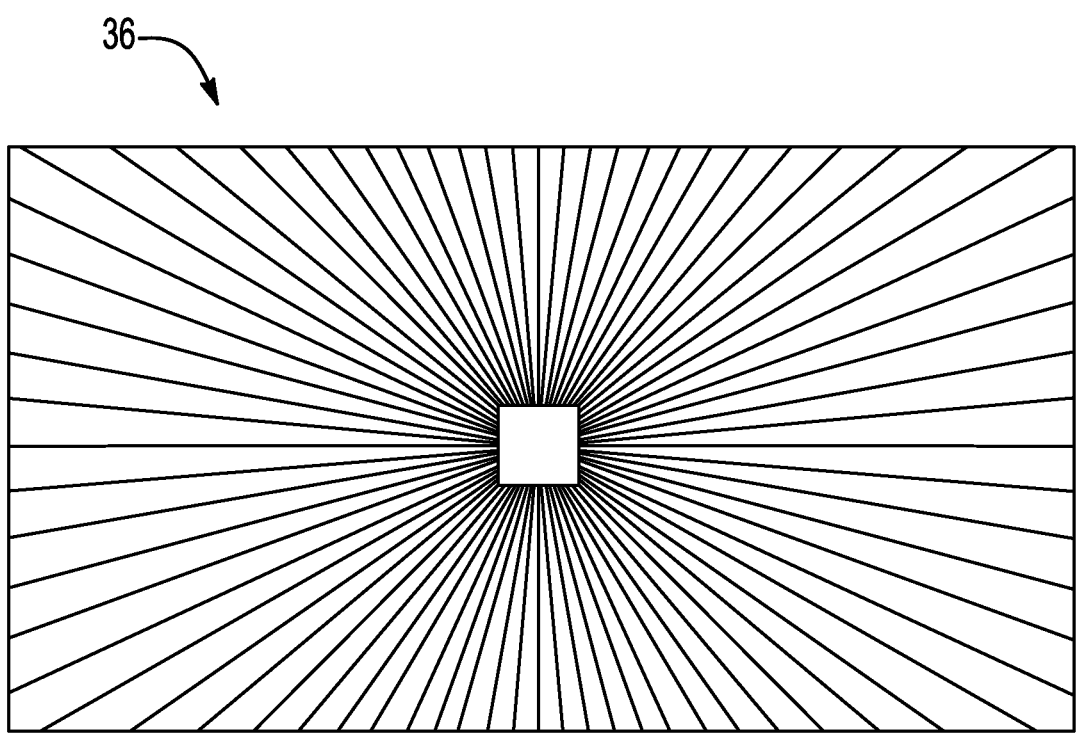
FIG. 4 shows an exemplary radial pattern for the metal-patterned substrate layer of FIG. 1.

Referring now to FIGS. 3-9, exemplary patterns for the patterned metal layer 28 (shown in FIG. 1) are shown, in addition to the barcode or bar pattern shown in FIG. 2. The patterns correspond to structures of the detector layer 26 (shown in FIG. 1). The patterns shown are merely exemplary and the patterned metal layer 28 may have many different patterns and shapes depending on the application. The patterns may be aligned to detector structures for MTF resolution testing, prior to operation, or structures used for spatial reference during calibration. In exemplary embodiments, a polarization grid structure may be formed by the patterns. The patterns may be ordered or disordered and may include any suitable shapes. FIG. 3 shows barcode-type patterns 34 that includes aligned rows and columns and FIG. 4 shows a radial pattern 36.

Figure 5:
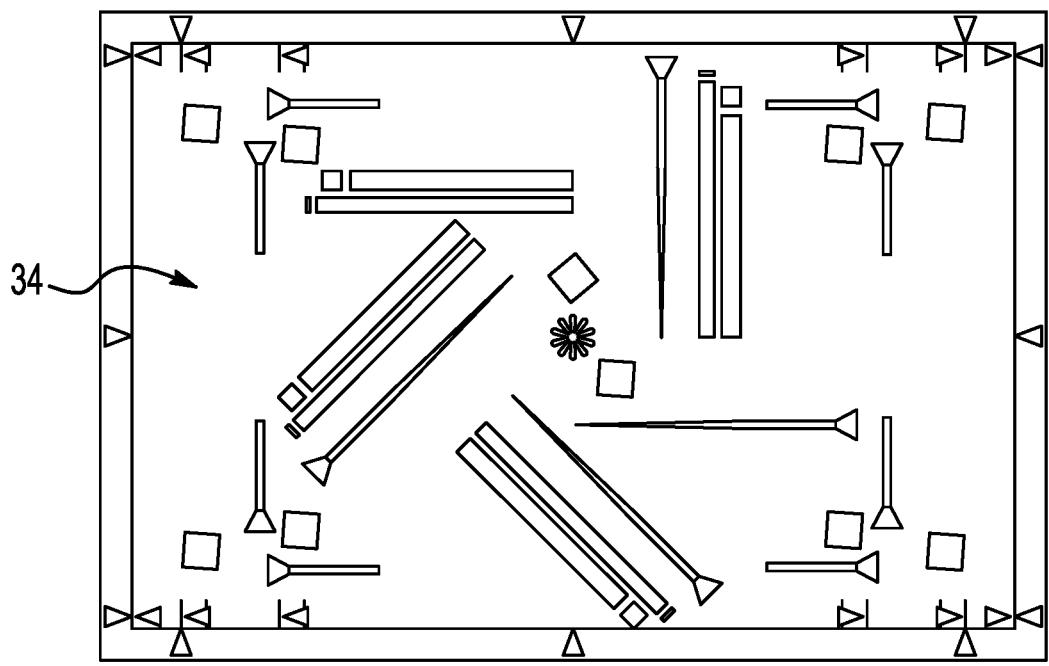
FIG. 5 shows an exemplary wedge pattern for the metal-patterned substrate layer of FIG. 1.
Figure 6:
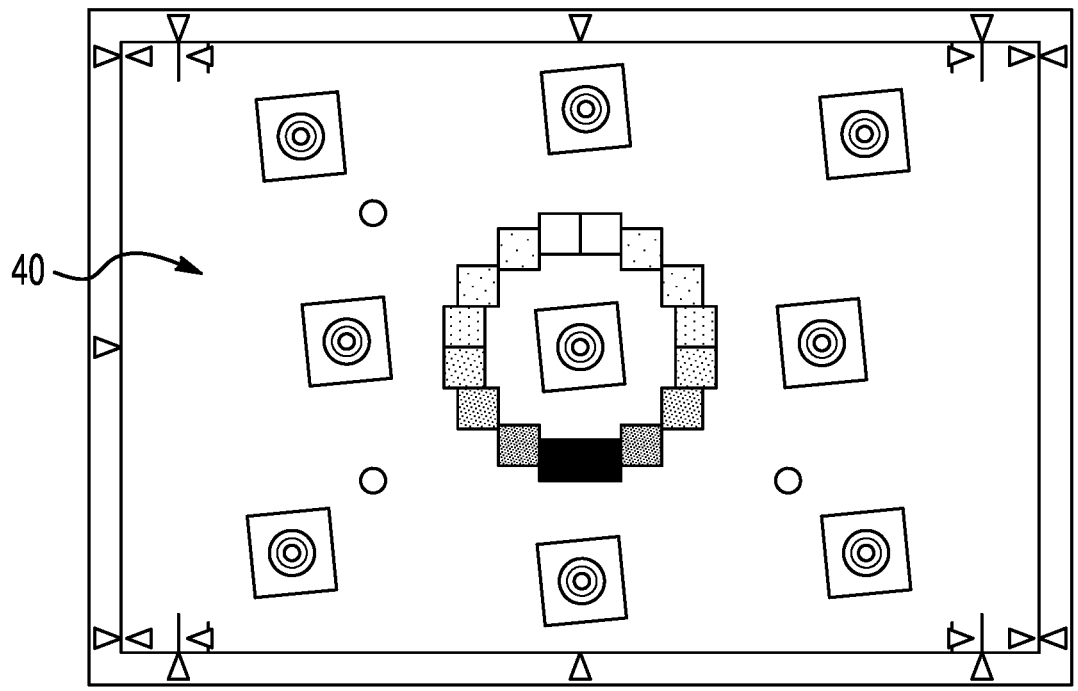
FIG. 6 shows an exemplary slanted square pattern for the metal-patterned substrate layer of FIG. 1.
Figure 7:
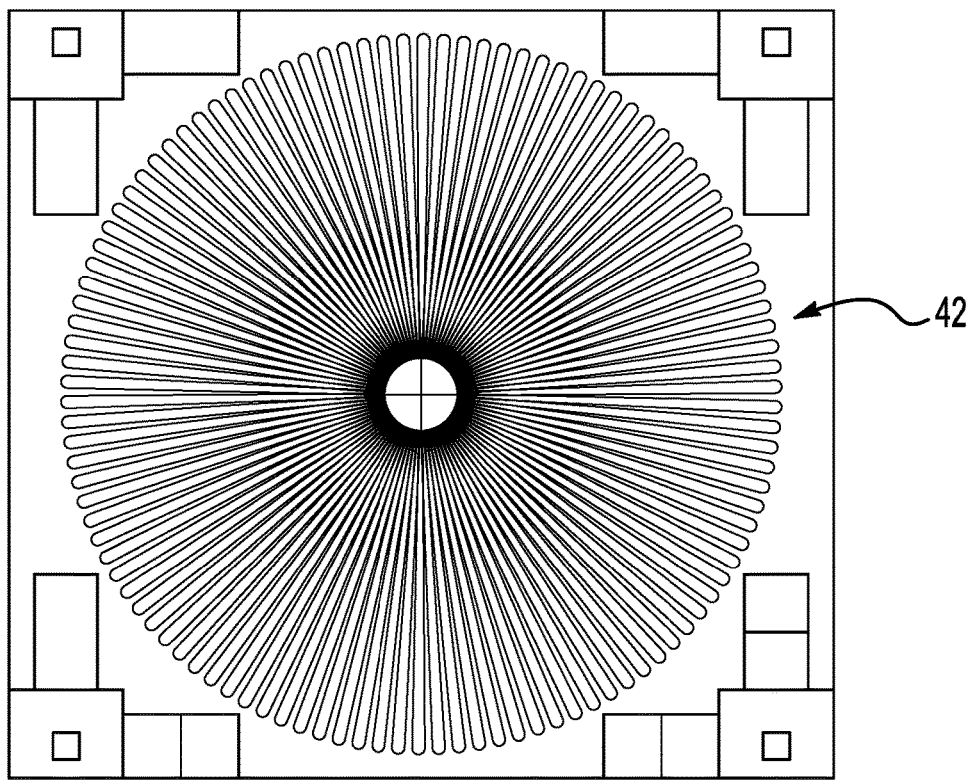
FIG. 7 shows an exemplary star pattern for the metal-patterned substrate layer of FIG. 1.
Figure 8:
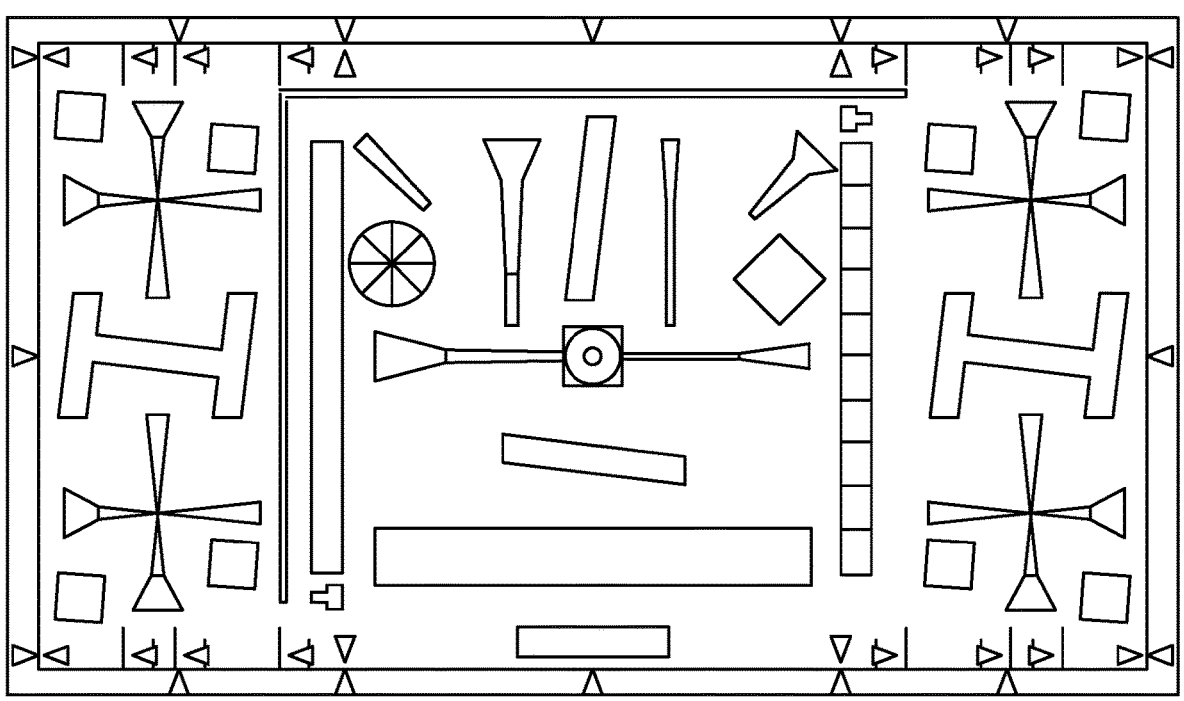
FIG. 8 shows still another exemplary pattern for the metal-patterned substrate layer of FIG. 1.

FIGS. 5-9B show various other patterns that may be used for MTF testing. FIG. 5 shows converging bar patterns 38 or "wedges" that include vertical, horizontal, and diagonal wedges. FIG. 6 shows a slanted square pattern 40 that uses slanted squared for slanted edge measurements. FIG. 7 shows a sine-based or star pattern 42 that may include registration marks on the sides of the image. FIG. 8 shows a standard pattern 44 from a conventional resolution test chart. Integrating the metal pattern directly into the substrate material adjacent the detector layer 26 is advantageous in that forming the metal-patterned substrate is compatible with many different wafer-scale processing methods and patterns.

Figure 9A:
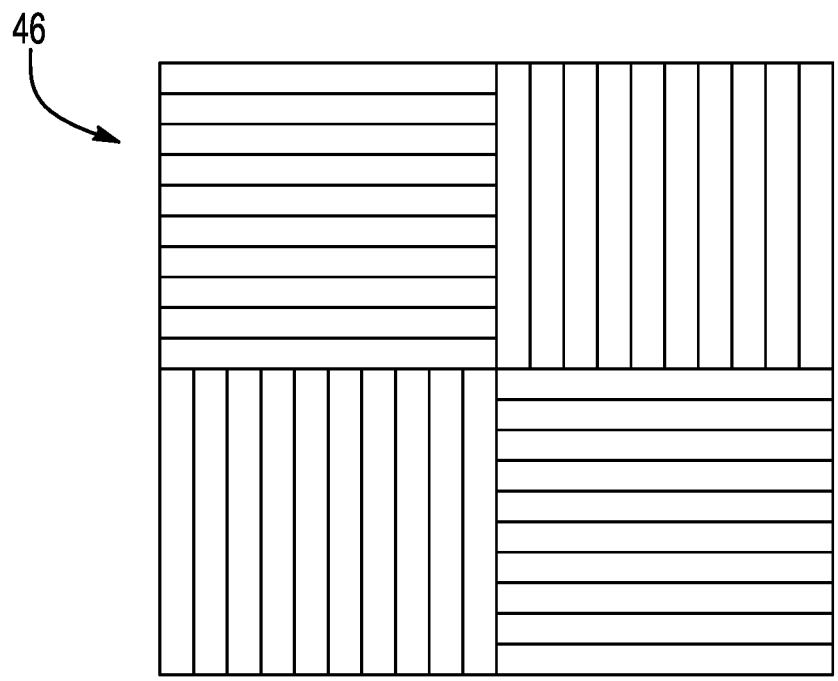
FIG. 9A shows an exemplary polarizer grid pattern having both horizontal and vertical polarization.
Figure 9B:
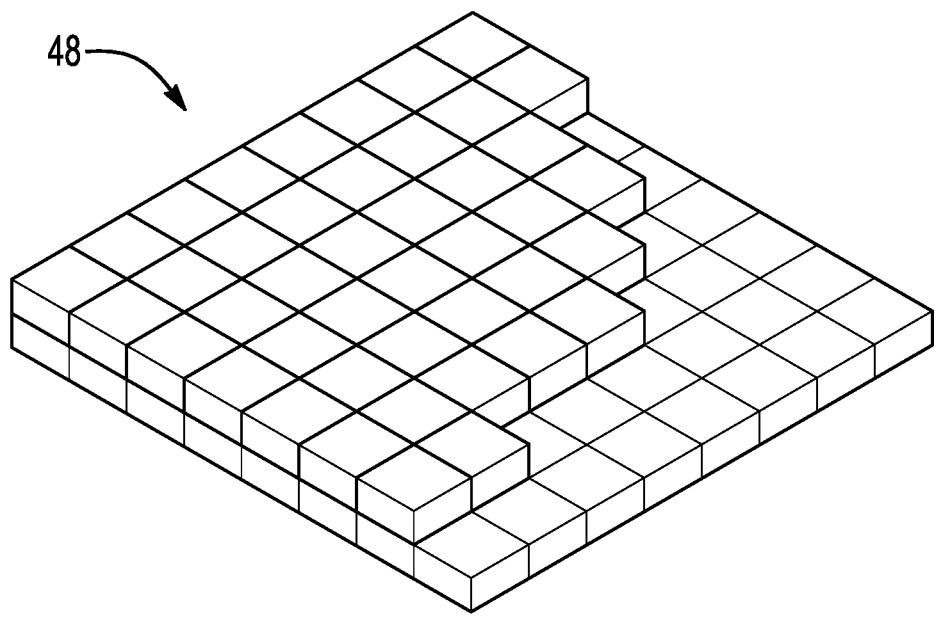
FIG. 9B shows another exemplary polarizer grid pattern that includes multiple polarization states.

FIGS. 9A and 9B show exemplary patterns for polarizer grids. The patterns may include metal grids for horizontal, vertical, and/or diagonal polarization. FIG. 9A shows a checkerboard pattern 46 which may be formed to achieve multiple polarizations with a single polarization for each pixel. As shown in FIG. 9A, the pattern may be formed to have both horizontal and vertical polarization. FIG. 9B shows another polarizer grid pattern 48 that includes multiple polarization states, such as for a Bayer filter mosaic or color filter array for arranging RGB (red, green, blue) color filters on a square grid of photosensors. Each color may have a separate polarization.

Figure 10:
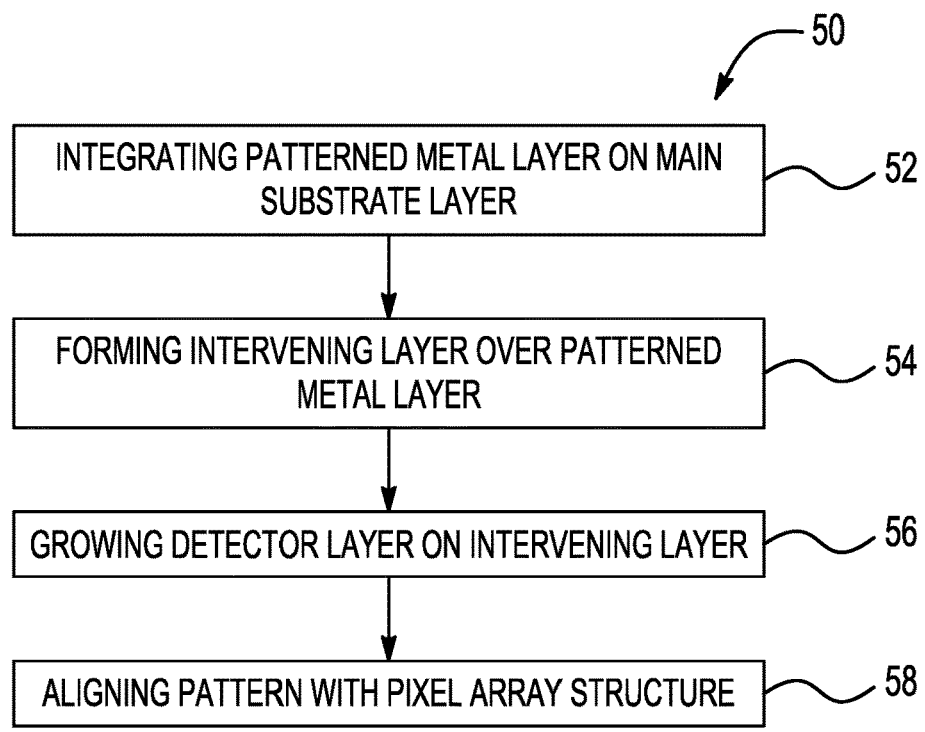
FIG. 10 shows a flowchart illustrating a method of forming an optical structure, such as the optical structure of FIG. 1.

Referring now to FIG. 10, a flowchart illustrating a method 50 of forming the optical device 20 (shown in FIGS. 1 and 2) is shown. Step 52 of the method 50 includes integrating the patterned metal layer 28 on the main substrate layer 24 and step 54 includes forming the intervening layer 30 over the patterned metal layer 28. Step 56 includes growing the detector layer 26 having a pixel array structure on the intervening layer 30. Step 58 includes aligning the pattern of the patterned metal layer 28 with the pixel array structure of the detector layer 26. Step 58 may include forming the pattern of rows or columns of bars, or other patterns for MTF measuring, or aligning the pattern of the patterned metal layer 28 with reference detector pixels of the pixel array structure for calibration. The pattern may also be formed as a polarizer grid for other exemplary applications.

Step 52 may include etching the pattern in the main substrate layer 24, depositing a metal material into the pattern, and planarizing a surface of the main substrate layer 24 containing the deposited metal material. Step 52 may include damascening or other integrated circuit interconnect methods. Step 54 may include capping the patterned main substrate layer 24 with a layer of substrate material having a thickness that is less than a thickness of the main substrate layer 24.

Figure 11:
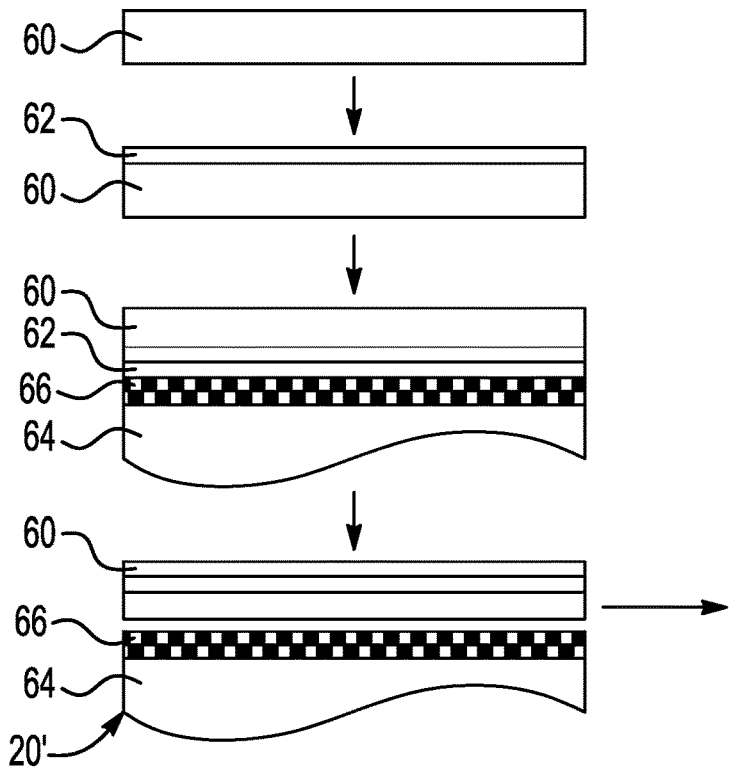
FIG. 11 shows an exemplary method of forming the optical structure of FIG. 1 that includes surface oxidation.

Referring in addition to FIG. 11, step 54 may include using direct bond hybridization. An exemplary method using oxidation to form the optical device 20' is shown in FIG. 11. Forming the optical device 20' may include starting with an initial wafer 60 and oxidizing the surface of the initial wafer 60 to form an oxidation layer 62. The wafer structure is then flipped and bonded to a main substrate layer 64 that includes the patterned metal layer 66. The initial wafer 60 may then be thinned to a desired thickness and the optical device 20' may be formed. Many other methods for forming the optical device may also be suitable.

Although the disclosure shows and describes certain preferred embodiment or embodiments, it is obvious that equivalent alterations and modifications will occur to others skilled in the art upon the reading and understanding of this specification and the annexed drawings. In particular regard to the various functions performed by the above described elements (external components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the disclosure. In addition, while a particular feature of the disclosure may have been described above with respect to only one or more of several illustrated embodiments, such feature may be combined with one or more other features of the other embodiments, as may be desired and advantageous for any given or particular application.

What is claimed is:

1. An optical device comprising:
   a main substrate layer;
   a detector layer having a pixel array structure;
   a patterned metal layer integrated in the main substrate layer such that the patterned metal layer is disposed on a top surface of the main substrate layer and disposed between the main substrate layer and a planarized top surface of the patterned metal layer, the patterned metal layer having a pattern that is aligned with selective regions of the pixel array structure of the detector layer for masking the selective regions; and
   an intervening layer interposed between the patterned metal layer and the detector layer.

2. The optical device according to claim 1, wherein the patterned metal layer is integrated into the main substrate layer.

3. The optical device according to claim 1, wherein the intervening layer has a thickness that is smaller than a thickness of the main substrate layer.

4. The optical device according to claim 1, wherein the patterned metal layer includes an opaque pattern.

5. The optical device according to claim 1, wherein the intervening layer is formed of a substrate material.

6. The optical device according to claim 1, wherein the intervening layer is formed of a plurality of sub-layers.

7. The optical device according to claim 1, wherein the intervening layer is an oxide layer.

8. The optical device according to claim 1, wherein the patterned metal layer includes a pattern that is formed of rows or columns of bars or a barcode pattern.

9. The optical device according to claim 1, wherein the selective regions of the pixel array structure correspond to reference detector pixels.

10. The optical device according to claim 1, wherein the pattern forms a polarizer grid.

11. A method of measuring a modulation transfer function of the optical device according to claim 1, the method comprising:
    masking the selective regions of the pixel array structure with the pattern of the patterned metal layer, the pattern being a bar pattern.

12. A method of calibrating an optical device that includes (i) a main substrate layer, (ii) a detector layer having a pixel array structure, (iii) a patterned metal layer that is disposed on a top surface of the main substrate layer and disposed between the main substrate layer and the detector layer, the patterned metal layer having a pattern, and (iv) an intervening layer interposed between the patterned metal layer and the detector layer, the method comprising:

aligning the pattern of the patterned metal layer to reference pixels of the pixel array structure for masking the reference pixels; and determining a spatial resolution of the optical device based on alignment of the patterned metal layer to the reference pixels during operation of the optical device.

13. A method of forming an optical device, the method comprising:

integrating a patterned metal layer in a main substrate layer such that the patterned metal layer is disposed on a top surface of the main substrate layer and disposed between the main substrate layer and a planarized top surface of the patterned metal layer;

forming an intervening layer over the patterned metal layer on the top surface of the patterned metal layer;

forming a detector layer having a pixel array structure on the intervening layer; and aligning a pattern of the patterned metal layer with the pixel array structure of the detector layer.

14. The method according to claim 13, wherein integrating the patterned metal layer in the main substrate layer includes:

etching the pattern in the main substrate layer;

depositing a metal material into trenches of the pattern; and planarizing a surface of the main substrate layer containing the deposited metal material.

15. The method according to claim 13, wherein integrating the patterned metal layer in the main substrate layer includes damascening.

16. The method according to claim 13, wherein forming the intervening layer includes capping the patterned metal layer with a layer of substrate material having a thickness that is less than a thickness of the main substrate layer.

17. The method according to claim 13, wherein forming the intervening layer includes using direct bond hybridization to form an oxide layer.

18. The method according to claim 13, wherein aligning the pattern of the patterned metal layer with the pixel array structure includes aligning the pattern with reference detector pixels of the pixel array structure for calibration.

19. The method according to claim 13, wherein the patterned metal layer includes a pattern of rows or columns of bars or a barcode pattern.

20. The method according to claim 13, further comprising forming the pattern as a polarizer grid.

\* \* \* \* \*